(12) United States Patent
Shimada et al.

(10) Patent No.: US 8,802,608 B2
(45) Date of Patent: Aug. 12, 2014

(54) COMPOSITION FOR CLEANING AND RUST PREVENTION AND PROCESS FOR PRODUCING SEMICONDUCTOR ELEMENT OR DISPLAY ELEMENT

(75) Inventors: Kenji Shimada, Tokyo (JP); Hiroshi Matsunaga, Tokyo (JP); Kojiro Abe, Chiba (JP); Kenji Yamada, Tokyo (JP)

(73) Assignee: Mitsubishi Gas Chemical Comany, Inc., Tokyo (JP)

( * ) Notice: Subject to any disclaimer, the term of this patent is extended or adjusted under 35 U.S.C. 154(b) by 555 days.

(21) Appl. No.: 12/668,695

(22) PCT Filed: Jul. 3, 2008

(86) PCT No.: PCT/JP2008/062109
§ 371 (c)(1),
(2), (4) Date: Jan. 12, 2010

(87) PCT Pub. No.: WO2009/013987
PCT Pub. Date: Jan. 29, 2009

(65) Prior Publication Data
US 2010/0197136 A1    Aug. 5, 2010

(30) Foreign Application Priority Data

Jul. 26, 2007 (JP) ................. 2007-194841

(51) Int. Cl.
*C11D 3/28* (2006.01)
*H01L 21/02* (2006.01)
*C11D 7/10* (2006.01)
*C11D 7/32* (2006.01)
*C11D 11/00* (2006.01)
*C11D 3/33* (2006.01)
*C11D 7/26* (2006.01)
*C11D 3/00* (2006.01)
*C23G 1/10* (2006.01)
*C23G 1/06* (2006.01)

(52) U.S. Cl.
CPC .......... *C23G 1/103* (2013.01); *H01L 21/02063* (2013.01); *C11D 7/10* (2013.01); *C11D 7/3245* (2013.01); *H01L 21/02068* (2013.01); *C11D 11/0047* (2013.01); *C11D 3/33* (2013.01); *C11D 7/3209* (2013.01); *C11D 7/3281* (2013.01); *C11D 7/265* (2013.01); *C11D 7/3263* (2013.01); *C11D 3/0073* (2013.01); *C11D 3/28* (2013.01); *C23G 1/06* (2013.01)
USPC .......................................... 510/175; 510/176

(58) Field of Classification Search
CPC ................... C11D 11/0047; C11D 3/0073
USPC ............................................... 510/175
See application file for complete search history.

(56) References Cited

U.S. PATENT DOCUMENTS

| | | | | |
|---|---|---|---|---|
| 4,800,153 | A * | 1/1989 | Morimoto et al. | 430/380 |
| 5,547,817 | A * | 8/1996 | Okada et al. | 430/393 |
| 5,885,757 | A * | 3/1999 | Inaba et al. | 430/430 |
| 6,323,169 | B1 * | 11/2001 | Abe et al. | 510/176 |
| 6,340,560 | B1 * | 1/2002 | Inaba et al. | 430/455 |
| 7,563,754 | B2 * | 7/2009 | Oowada et al. | 510/175 |
| 7,572,758 | B2 * | 8/2009 | Shimada et al. | 510/175 |
| 7,671,001 | B2 * | 3/2010 | Skee | 510/175 |
| 7,947,637 | B2 * | 5/2011 | Kneer | 510/175 |
| 8,062,429 | B2 * | 11/2011 | Lee | 134/1.3 |
| 2002/0005017 | A1 | 1/2002 | Motonari et al. | |
| 2003/0143495 | A1 | 7/2003 | Ishikawa et al. | |
| 2004/0224866 | A1 | 11/2004 | Matsunaga et al. | |
| 2005/0261151 | A1 | 11/2005 | Lee et al. | |
| 2005/0288199 | A1 * | 12/2005 | Oowada et al. | 510/175 |
| 2006/0040838 | A1 * | 2/2006 | Shimada et al. | 510/175 |
| 2007/0060490 | A1 * | 3/2007 | Skee | 510/175 |
| 2007/0099810 | A1 * | 5/2007 | Matsunaga et al. | 510/302 |
| 2007/0179072 | A1 * | 8/2007 | Rao et al. | 510/175 |
| 2007/0235061 | A1 * | 10/2007 | Mizuta et al. | 134/2 |
| 2008/0004197 | A1 * | 1/2008 | Kneer | 510/245 |
| 2008/0169004 | A1 * | 7/2008 | Wu | 134/2 |
| 2009/0107520 | A1 * | 4/2009 | Lee et al. | 134/2 |
| 2009/0130849 | A1 * | 5/2009 | Lee | 438/693 |
| 2009/0131295 | A1 * | 5/2009 | Cui | 510/176 |
| 2009/0133716 | A1 * | 5/2009 | Lee | 134/3 |
| 2009/0137191 | A1 * | 5/2009 | Lee | 451/36 |
| 2009/0239380 | A1 * | 9/2009 | Tomiga et al. | 438/693 |

| | | | | |
|---|---|---|---|---|
| 2009/0301996 | A1* | 12/2009 | Visintin et al. | 216/13 |
| 2010/0043823 | A1* | 2/2010 | Lee | 134/1.3 |
| 2010/0056409 | A1* | 3/2010 | Walker et al. | 510/175 |
| 2010/0105595 | A1* | 4/2010 | Lee | 510/176 |
| 2010/0163788 | A1* | 7/2010 | Visintin et al. | 252/79.3 |
| 2010/0197136 | A1* | 8/2010 | Shimada et al. | 438/653 |
| 2010/0261632 | A1* | 10/2010 | Korzenski et al. | 510/175 |

FOREIGN PATENT DOCUMENTS

| | | |
|---|---|---|
| CN | 1526807 | 9/2004 |
| JP | 2000-282096 | 10/2000 |
| JP | 2001-22096 | 1/2001 |
| JP | 2001-279231 | 10/2001 |
| JP | 2002-97584 | 4/2002 |
| JP | 2002-289569 | 10/2002 |
| JP | 2003-35963 | 2/2003 |
| JP | 2003-167360 | 6/2003 |
| JP | 2005-502734 | 1/2005 |
| JP | 2005-286058 | 10/2005 |
| JP | 2005-333104 | 12/2005 |
| JP | 2006-83376 | 3/2006 |
| WO | 02-077120 | 10/2002 |

OTHER PUBLICATIONS

China Office action, mail date is Dec. 31, 2010.

* cited by examiner

*Primary Examiner* — Gregory Webb

(74) *Attorney, Agent, or Firm* — Greenblum & Bernstein, P.L.C.

(57) ABSTRACT

A composition for cleaning and corrosion inhibition which is used in a step of manufacturing a semiconductor device or a display device having a copper-containing metallic wiring is provided, wherein the corrosion inhibitor component is any one of pyrazole, a pyrazole derivative such as 3,5-dimethylpyrazole, a triazole derivative such as 1,2,4-triazole, an aminocarboxylic acid such as iminodiacetic acid or ethylenediaminedipropionic acid hydrochloride, or a disulfide compound such as diisopropyl disulfide or diethyl disulfide; and the cleaning agent component is any one of ammonium fluoride, tetramethylammonium fluoride, ammonium acetate, acetic acid, glyoxylic acid, oxalic acid, ascorbic acid, 1,2-diaminopropane or dimethylacetamide. Also, a method for manufacturing a semiconductor device or the like using the composition for cleaning and corrosion inhibition is provided.

6 Claims, 1 Drawing Sheet

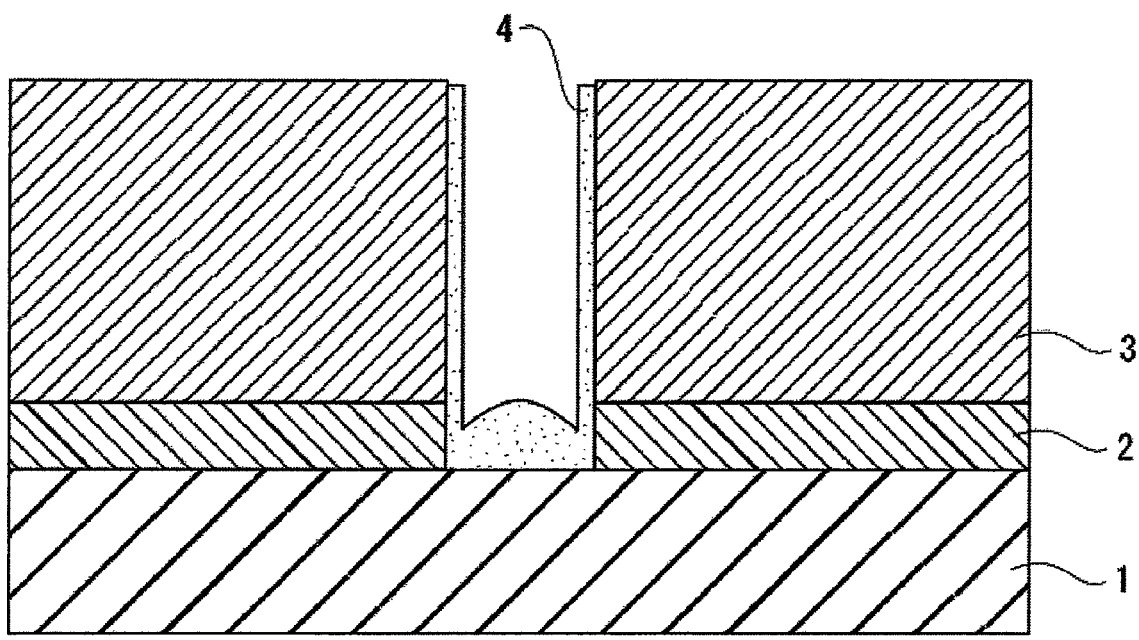

COMPOSITION FOR CLEANING AND RUST PREVENTION AND PROCESS FOR PRODUCING SEMICONDUCTOR ELEMENT OR DISPLAY ELEMENT

TECHNICAL FIELD

The present invention relates to a composition for cleaning and corrosion inhibition which in a step of manufacturing a semiconductor device or a display device, is capable of removing an etching residue on the surface of a material to be treated, preventing the denaturation of a metallic wiring containing copper or a copper alloy and easily removing a corrosion inhibitor adhered onto the metallic wiring before fabrication in a fabrication step and to a method for manufacturing a semiconductor device or a display device by using the subject composition for cleaning and corrosion inhibition.

BACKGROUND ART

In general, a lithography method is adopted as a method for manufacturing a semiconductor device such as a highly integrated LSI or the like. In the case of manufacturing a semiconductor device by this lithography method, a series of steps as described below are usually applied. First of all, a conductive thin film such as a metallic film or the like, which will work as a conductive wiring material, or an interlayer insulating film such as a silicon oxide film or the like for the purpose of achieving insulation between wirings, on a substrate such as a silicon wafer or the like. Thereafter, a photoresist is uniformly coated on the surface thereof to provide a photosensitive layer, which is then subjected to selective exposure and a development treatment to form a desired resist pattern. Subsequently, the thin film as a lower layer part is subjected to a selective etching treatment through this resist pattern as a mask to form a desired wiring pattern on the subject thin film. Then, the resist pattern is completely removed, thereby accomplishing a series of steps.

In recent years, in semiconductor devices, high integration is advanced, and ultra-microfabrication of a pattern processing size becomes necessary. Following this, a dry etching method has become the main current in the foregoing selective etching treatment. In the dry etching treatment, it is known that a residue to be caused due to a dry etching gas, a resist, a film to be processed, a treatment chamber member in a dry etching apparatus, etc. (the residue will be hereinafter referred to as "etching residue") is formed in the surroundings of the formed pattern. In particular, when this etching residue remains in the inside of a via hole and the surroundings thereof, a non-preferable situation including high resistance, the generation of an electric short circuit or the like is brought.

The microfabrication of a circuit has been advanced in this way; and therefore, with respect to wiring materials, those which have hitherto been frequently used and which are composed mainly of aluminum are excessively high in resistance, and it has become difficult to operate the circuit at a designated speed. Then, the utilization of copper which is smaller in electrical resistance than aluminum and which has an excellent migration characteristic is rising.

However, when copper comes into contact with an insulating material, it is diffused into the insulating material, thereby lowering its insulating properties. For that reason, a film for preventing the diffusion of copper (hereinafter referred to as "diffusion preventive film") must be provided. When an etching residue is removed, a part of the copper wiring is exposed; and therefore, it is necessary to form the foregoing diffusion preventive film on the exposed copper in a subsequent step. However, when the etching residue is removed, whereby copper is exposed, copper is very likely denatured; and therefore, corrosion, oxidation or the like is caused prior to the protection of copper by the diffusion preventive film.

In general, while there is included a step of rinsing the cleaning solution with an organic solvent or ultrapure water just after cleaning, the ultrapure water easily absorbs carbon dioxide in the air and displays weak acidity. In the case of cleaning copper with this weakly acidic water, the corrosion of copper is observed. Also, in the case of allowing copper to stand in the air, the surface thereof is oxidized due to an action of oxygen in the air. The thus denatured copper causes an increase in the electrical resistance or a lowering in the adhesiveness to the diffusion preventive metallic film; and also, in the case where the denaturation is corrosion, the denatured copper causes the generation of a void or the like. In recent years, with the progress of microfabrication, even slight denaturation which has been tolerated so far largely influences the performance of a semiconductor device, leading to a cause of inferiority. As a method for preventing such inferiority, it may be considered to make a corrosion inhibitor for preventing the denaturation of exposed copper to adhere thereonto.

Similar to the denatured copper in a step of depositing the diffusion preventive film, the corrosion inhibitor which is effective for preventing the corrosion of the copper surface causes an increase in the electrical resistance, a lowering in the adhesiveness to the diffusion preventive film, the generation of a void or the like. In consequence, it is necessary to surely remove the adhered corrosion inhibitor to an extent that there is no problem in practical use. However, the removal of the corrosion inhibitor is not easy. Also, when the copper is exposed to the air for a long period of time from the removal of the corrosion inhibitor from the copper surface until the deposition of the diffusion preventive film, denaturation occurs; and therefore, there is brought no effect unless the removal of the corrosion inhibitor is carried out just before depositing the diffusion preventive film.

In this way, in order to obtain a semiconductor device with high precision and high quality, it is extremely important to suppress the denaturation of copper inclusive of corrosion from just after removing an etching residue with a cleaning solution until just before depositing a diffusion preventive film on the surface and to expose a clean copper surface in a step of forming the diffusion preventive film. Accordingly, there is demanded a cleaning solution having both cleaning and corrosion resistance, which has a capability to remove an etching residue, suppresses the denaturation of copper from just after removing an etching residue until just before depositing a diffusion preventive film on the surface and at the time of depositing a diffusion preventive film, provides a clean copper surface.

As a cleaning solution which copes with a copper wiring, there has hitherto been proposed a cleaning solution composed of ammonium fluoride, a polar organic solvent, water and an epoxy polyamide (see JP-A-2002-289569). However, according to this technology, even when the denaturation during the cleaning is prevented, the denaturation after cleaning cannot be prevented. That is, the denaturation of the foregoing copper wiring cannot be prevented.

As a cleaning solution containing a corrosion inhibitor which copes with a copper wiring, there has been proposed a cleaning solution containing a 1,3-dicarbonyl compound as a corrosion inhibitor (see JP-T-2005-502734). However, according to this cleaning solution, a step of rinsing with ultrapure water or an organic solvent which is carried out just after cleaning is necessary, and at that time, the corrosion inhibitor is also removed. Accordingly, the corrosion after cleaning cannot be prevented.

In addition to these technologies, as a cleaning solution containing a corrosion inhibitor which copes with a copper wiring, there have been proposed cleaning solutions containing a benzotriazole compound, a vinyl carboxylic acid or a reducing agent as a corrosion inhibitor (see JP-A-2001-22096, JP-A-2003-35963 and JP-A-2003-167360) and so on. As described previously, only in the case where the corrosion inhibitor protects a copper wiring from just after removing an etching residue until just before depositing a diffusion preventive film and is completely separated just before depositing a diffusion preventive film, an effect for preventing the denaturation of the copper wiring is obtainable. That is, in the case of using the corrosion inhibitor, a high-quality semiconductor device cannot be obtained unless not only the corrosion inhibition during the cleaning but the removal of the corrosion inhibitor is carried out at appropriate timing. In these foregoing technologies, any disclosure or suggestion regarding a removal method of the corrosion inhibitor is not described at all.

JP-A-2002-97584 discloses a cleaning solution in which a heterocyclic compound having a nitrogen-atom-containing 6-membered ring, such as purine, nicotine or the like, is added as a corrosion inhibitor for copper wirings on a semiconductor wafer. Such a corrosion inhibitor is not removed, or when a silicon nitride film is fabricated on the subject copper wiring, the corrosion inhibitor is removed. However, any disclosure or suggestion regarding the corrosion inhibition of the copper wiring which is caused from after cleaning until the fabrication of a silicon nitride film is not described at all.

JP-A-2001-279231 proposes a liquid containing a compound having a heterocyclic 5-membered ring, such as bipyridyl, biphenol, vinylpyridine, salicylaldoxime, 7-hydroxy-5-methyl-1,3,4-triazaindolizine, 2-amino-1,3,4-thiadiazole or the like, as a corrosion inhibitor for copper wirings. However, this technology is concerned with a technology in a polishing step but is not aimed to suppress the corrosion of a copper wiring from a residue removal step until just before depositing a diffusion preventive film.

JP-A-2000-282096 and JP-A-2005-333104 disclose cleaning solutions containing an imidazole, a thiazole or a triazole as a corrosion inhibitor but do not disclose a removal method of the corrosion inhibitor.

Under the foregoing circumstances, a cleaning solution which is able to suppress the denaturation of copper inclusive of corrosion from the removal of an etching residue until just before depositing a diffusion preventive film on the surface of a copper wiring and which at the time of depositing a diffusion preventive film, is able to easily remove a corrosion inhibitor component, thereby providing a clean copper surface is eagerly demanded.

DISCLOSURE OF THE INVENTION

Problems that the Invention is to Solve

The present invention is to provide a composition for cleaning and corrosion inhibition which in a step of manufacturing a semiconductor device or a display device having a copper-containing metallic wiring, exhibits "cleaning properties" such that an etching residue firmly adhered onto the surface of a material to be treated after an etching treatment can be removed without damaging the metallic wiring on the semiconductor device or display device, an interlayer insulating film or the like; "corrosion resistance" such that the obtained clean metallic wiring is prevented from corrosion; and "easy removal properties" such that a corrosion inhibitor component is easily removed from the metallic wiring by a prescribed treatment just before the metallic wiring is covered by a diffusion preventive film.

Also, the present invention is to provide a method for manufacturing a semiconductor device or a display device capable of preventing the denaturation of a copper-containing metallic wiring while cleaning and removing an etching residue by using the subject composition for cleaning and corrosion inhibition.

Means for Solving the Problems

In order to solve the foregoing problems, the present inventors made extensive and intensive investigations regarding various cleaning agent components and corrosion inhibitor components. As a result, it has been found that a combination of any one corrosion inhibitor of specified pyrazole derivatives, triazole derivatives, amino carboxylic acids or disulfide compounds with a specified cleaning agent is satisfied with the foregoing "cleaning properties", "corrosion resistance" and "easy removal properties", leading to accomplishment of the present invention.

That is, the present invention is as follows.

A composition for cleaning and corrosion inhibition which is used in a step of manufacturing a semiconductor device or a display device having a copper-containing metallic wiring, the composition comprising a corrosion inhibitor component and a cleaning agent component, wherein the foregoing corrosion inhibitor component is at least one member selected from the group consisting of pyrazole, 3,5-dimethylpyrazole, 3,5-pyrazoledicarboxylic acid monohydrate, pyrazole-1-carboxamidine hydrochloride, 3-amino-5-hydroxypyrazole, 1-phenylpyrazole, 3-amino-4-phenylpyrazole, 1,2,4-triazole, 4-amino-3,5-dimethyl-1,2,4-triazole, iminodiacetic acid, hydroxyethylenediaminetriacetic acid, glycol ether diaminetetraacetic acid, hydroxyethyliminodiacetic acid, triethylenetetraminehexaacetic acid, ethylenediaminedipropionic acid hydrochloride, diisopropyl disulfide, dibutyl disulfide and diethyl disulfide; and the foregoing cleaning agent component is at least one member selected from the group consisting of ammonium fluoride, tetramethylammonium fluoride, ammonium acetate, acetic acid, glyoxylic acid, oxalic acid, ascorbic acid, 1,2-diaminopropane and dimethylacetamide.

Also, a method for manufacturing a semiconductor device or a display device comprising a wiring pattern forming step of forming a copper-containing conductive thin film serving as a conductive wiring and an interlayer insulating film for insulating wirings from each other successively on a substrate, coating a photoresist on the surface thereof to form a photosensitive layer, subjecting this to selective exposure and a development treatment to form a resist pattern, applying an etching treatment while using this resist pattern as a mask and then removing the resist through ashing to form a wiring pattern;

a cleaning treatment step of removing an etching residue after the etching treatment through a cleaning treatment;

a heating treatment step of applying a heating treatment after the foregoing cleaning treatment; and a diffusion preventive film forming step of forming a diffusion preventive film on the surface of the wiring pattern exposed by the foregoing heating treatment, wherein the composition for cleaning and corrosion inhibition as set for forth in claim 1 is used for the cleaning treatment in the foregoing cleaning treatment step; and a condition of the heating treatment in the foregoing heating treatment step is from 0.001 to 600 Pa for the pressure and from 100° C. to 300° C. for the temperature, respectively.

BRIEF DESCRIPTION OF THE DRAWINGS

FIG. 1 is a partial sectional view schematically showing the state of an etching residue formed after dry etching.
1: Conductive thin film
2: Silicon carbide film
3: Low-k film
4: Etching residue

BEST MODES FOR CARRYING OUT THE INVENTION

[1. Composition for Cleaning and Corrosion Inhibition]

The composition for cleaning and corrosion inhibition according to the present invention contains a prescribed corrosion inhibitor component and a prescribed cleaning agent component. These are hereunder described.

(Corrosion Inhibitor Component)

Since the corrosion inhibitor component according to the present invention is one to be mixed together with the cleaning agent component, not only it should not hinder cleaning, but it should be completely removed for the purpose of securing a clean metallic wiring surface by a prescribed treatment (heating under a reduced pressure). When the corrosion inhibitor component adheres to not only a metallic wiring but a metallic wiring oxide which is one of objects to cleaning, a sufficient cleaning capability is not obtainable. Accordingly, it is necessary to select a corrosion inhibitor component which selectively adheres to a clean metallic wiring. Also, when the corrosion inhibitor component strongly bonds to the metallic wiring, it becomes difficult to remove the corrosion inhibitor component from the metallic wiring surface by heating under a reduced pressure. Accordingly, it is necessary to select a corrosion inhibitor component having properties to adhere with an appropriate strength.

As the corrosion inhibitor component (corrosion inhibitor) which is used in the present invention, first of all, a compound having a heterocyclic ring containing two or three nitrogen atoms, with at least two of the nitrogen atoms being adjacent to each other, or a derivative thereof is exemplified. Specifically, pyrazole or specified pyrazole derivatives, or specified triazole derivatives such as 1,2,3-triazole derivatives, 1,2,4-triazole derivatives or the like are used. Alternatively, specified amino polycarboxylic acids or specified disulfide compounds are used. These corrosion inhibitor components may be used singly or in combinations of two or more kinds thereof.

The concentration of the corrosion inhibitor component in the composition for cleaning and corrosion inhibition is preferably from 0.001 to 5% by mass, and more preferably from 0.005 to 3% by mass. When the concentration of the corrosion inhibitor component is 0.001% by mass or more, the corrosion inhibitory effect against a copper wiring can be made sufficient; and when the concentration is not more than 5% by mass, it is possible to contrive to balance the corrosion inhibitory effect and the economy each other.

As the pyrazole or specified pyrazole derivative or the specified triazole derivative, any one of pyrazole, pyrazole-1-carboxamidine hydrochloride, 3,5-dimethylpyrazole, 3,5-pyrazoledicarboxylic acid monohydrate, 3-amino-5-hydroxypyrazole, 1-phenylpyrazole, 3-amino-4-phenylpyrazole, 1,2,3-triazole, 1,2,4-triazole, 3-amino-1,2,4-triazole, 4-amino-1,2,4-triazole or 4-amino-3,5-dimethyl-1,2,4-triazole is used.

Of these, pyrazole-1-carboxamidine hydrochloride, 3,5-dimethylpyrazole, 3,5-pyrazoledicarboxylic acid monohydrate, 3-amino-5-hydroxypyrazole, 1-phenylpyrazole, 3-amino-4-phenylpyrazole, 1,2,4-triazole and 4-amino-3,5-dimethyl-1,2,4-triazole are preferable. Also, 3,5-dimethylpyrazole is the most preferable.

As the specified amino polycarboxylic acid, any one of ethylenediaminetetraacetic acid, hydroxyethylenediaminetriacetic acid, glycol ether diaminetetraacetic acid, iminodiacetic acid, hydroxyethyliminodiacetic acid, triethylenetetraminehexaacetic acid, diaminocyclohexanetetraacetic acid, diethylenetriaminepentaacetic acid or ethylenediaminedipropionic acid hydrochloride is used. Of these, iminodiacetic acid, hydroxyethylenediaminetriacetic acid, glycol ether diaminetetraacetic acid, hydroxyethyliminodiacetic acid, triethylenetetraminehexaacetic acid and ethylenediaminedipropionic acid hydrochloride are preferable, with iminodiacetic acid, hydroxyethylenediaminetriacetic acid, glycol ether diaminetetraacetic acid, hydroxyethyliminodiacetic acid, triethylenetetraminehexaacetic acid and ethylenediaminedipropionic acid hydrochloride being especially preferable.

As the specified disulfide compound, any one of diethyl disulfide, diisopropyl disulfide or dibutyl disulfide is used. Of these, diethyl disulfide and diisopropyl disulfide are preferable, with diethyl disulfide being especially preferable.

It is necessary to select the corrosion inhibitor component such that it adheres selectively to a clean metallic wiring with an appropriate strength. In general, nitrogen, oxygen and sulfur are easy to form a complex with copper. It may be assumed that the foregoing compounds form a complex together with copper to display a corrosion inhibitory effect. Also, it may be assumed that the bonding strength is controlled appropriately due to steric hindrance or electron density. As the foregoing corrosion inhibitor component, for example, it is preferable to use one capable of being separated at about 200° C.

The corrosion inhibitor component according to the present invention can be added in a cleaning agent component as described later in a state that the foregoing specified corrosion inhibitor component is mixed in an aqueous solution or a water-soluble organic solvent.

As the water-soluble organic solvent, N,N-dimethylformamide, dimethyl sulfoxide, N-methyl-2-pyrrolidone, γ-butyrolactone, ethylene glycol monomethyl ether and the like can be exemplified. However, it should not be construed that the present invention is limited thereto.

(Cleaning Agent Component)

As the cleaning agent component (cleaning agent), any one of ammonium fluoride, tetramethylammonium fluoride, ammonium acetate, acetic acid, glyoxylic acid, oxalic acid, ascorbic acid, 1,2-diaminopropane or dimethylacetamide is used. Of these, ammonium fluoride, tetramethylammonium fluoride, ammonium acetate, acetic acid and 1,2-diaminopropane are preferable.

The concentration of the cleaning agent component in the composition for cleaning and corrosion inhibition is preferably from 0.01 to 90% by mass, and more preferably from 0.03 to 86% by mass. When the concentration is 0.01% by mass or more, the cleaning effect can be made sufficient; and when the concentration is not more than 90% by mass, it is possible to contrive to balance the cleaning effect and the economy each other.

The composition for cleaning and corrosion inhibition of the present invention is obtainable by mixing the foregoing specified corrosion inhibitor component and cleaning agent component (each of the components may be mixed in a specified solvent). In the composition for cleaning and corrosion inhibition, additives which have hitherto been used in cleaning solutions may be blended, if desired within the range where the object of the present invention is not impaired.

Each of the semiconductor device and the display device to which the composition for cleaning and corrosion inhibition of the present invention is applicable is not particularly limited so far as it is composed mainly of Cu as a wiring material. Examples thereof include semiconductor devices and display devices containing a substrate material such as silicon, amorphous silicon, polysilicon, glass or the like; an insulating material such as silicon oxide, silicon nitride, silicon carbide, derivatives thereof or the like; a barrier material such as titanium, titanium nitride, tantalum, tantalum nitride or the like; and a wiring material composed mainly of copper and containing tungsten, titanium-tungsten, aluminum, an aluminum alloy, chromium, a chromium alloy or the like; compound semiconductors such as gallium-arsenic, gallium-phosphorus, indium-phosphorus or the like; oxide semiconductors such as chromium oxide or the like; and so on.

[2. Manufacturing Method of Semiconductor Device or Display Device]

The manufacturing method of a semiconductor device or a display device according to the present invention includes a wiring pattern forming step of forming a copper-containing conductive thin film serving as a conductive wiring and an interlayer insulating film for insulating wirings from each other successively on a substrate, coating a photoresist on the surface thereof to form a photosensitive layer, subjecting this to selective exposure and a development treatment to form a resist pattern, applying an etching treatment while using this resist pattern as a mask and then removing the resist through ashing to form a wiring pattern; a cleaning treatment step of removing the resist and an etching residue after the etching treatment through a cleaning treatment; a heating treatment step of applying a heating treatment after the cleaning treatment; and a diffusion preventive film forming step of forming a diffusion preventive film on the surface of the wiring pattern exposed by the heating treatment.

In the cleaning treatment in the cleaning treatment step, the composition for cleaning and corrosion inhibition of the present invention is used.

The temperature of the cleaning treatment is preferably in the range of from 20 to 50° C. and may be properly selected depending upon a condition of the etching or a semiconductor substrate to be used.

If desired, ultrasonic waves can be used in combinations for the cleaning treatment. As a rinse solution after removing the etching residue on the semiconductor substrate by the cleaning treatment, it is not necessary to use an organic solvent such as alcohols, but it is sufficient to achieve rinse only by using water. Even after the cleaning treatment, an exposed portion of the wiring pattern is covered by the corrosion inhibitor component with an appropriate adhesion (an adhesion to an extent that the corrosion inhibitor component is removed by the heating treatment as described later), and therefore, even after subsequent storage for a long period of time, it is possible to continue to reveal the corrosion inhibitory effect.

In the heating treatment in the heating treatment step, it is necessary to separate the corrosion inhibitor component to an extent that there is no problem in practical use before forming a diffusion preventive film in the subsequent diffusion preventive film forming step. For that reason, it is necessary to set up the system at a prescribed degree of reduced pressure at the time of heat treatment, and its pressure is from 0.001 to 600 Pa. In the case where the pressure in achieving the separation exceeds 600 Pa, the corrosion inhibitor component cannot be removed to an extent that there is no problem in practical use, whereby it remains on the copper surface. Also, in the case of applying a compound capable of being completely separated under a pressure exceeding 600 Pa as the desired corrosion inhibitor component in the present invention, there may be a case where the separation of a part of the corrosion inhibitor occurs even under a condition at about 25° C. at atmospheric pressure, the corrosion inhibitory effect is insufficient. From the viewpoint of practical use, a lower limit of the pressure in achieving the separation is 0.001 Pa.

For the purpose of separating the corrosion inhibitor component according to the present invention to an extent that there is no problem in practical use under the foregoing reduced pressure, the temperature (heating treatment temperature) is from 100° C. to 300° C., preferably from 120° C. to 280° C., and more preferably from 150° C. to 250° C.

In the case of a compound capable of being completely separated at a temperature of lower than 100° C., the separation of a part of the corrosion inhibitor occurs even under a condition at about 25° C. at atmospheric pressure, and the corrosion inhibitory effect is insufficient. In the case of a compound which is not separated unless the temperature exceeds 300° C., it damages the semiconductor device in a step of separating the corrosion inhibitor.

For the etching condition as well as the forming condition and material and the like in each of the layers applied in the foregoing wiring pattern forming step, technologies which have hitherto been generally known can be applied. Also, for the material and forming method of the diffusion preventive film in the diffusion preventive film forming step, technologies which have hitherto been generally known can be applied.

Next, the present invention is more specifically described with reference to the following Examples and Comparative Examples. However, it should be construed that the present invention is not limited to these Examples whatever.

(Manufacture of Semiconductor Device)

A semiconductor device was manufactured as follows.

First of all, as shown in FIG. 1, a silicon carbide film 2 and a Low-k film 3 as an interlayer insulating film were deposited successively on a conductive thin film 1 as a copper wiring by the CVD method. Thereafter, a resist was coated, and the resist was processed using a usual photo technology. The Low-k film 3 and the silicon carbide film 2 were subjected to etching processing into a desired pattern utilizing a dry etching technology to form a via hole, and the resist was removed by means of ashing, thereby preparing a semiconductor device. An etching residue 4 adhered onto the inner wall of the via hole of the semiconductor device after the preparation.

Examples 1 to 20 and Comparative Examples 1 to 20

Each of corrosion inhibitor components shown in the following Tables 1 and 2 was mixed with the following cleaning agent components, thereby preparing compositions for cleaning and corrosion inhibition of Examples 1 to 20 and Comparative Examples 1 to 20. Using these compositions for cleaning and corrosion inhibition, the following evaluations were carried out.

(Cleaning Agent Components)
Solution A
  Ammonium fluoride: 0.4% by mass, glyoxylic acid: 0.03% by mass, water: balance
Solution B
  Acetic acid: 12% by mass, ammonium acetate: 15.2% by mass, dimethylacetamide: 57.5% by mass, ammonium fluoride: 1% by mass, water: balance
Solution C
  Oxalic acid: 3.4% by mass, ascorbic acid: 0.05% by mass, water: balance
Solution D
  1,2-Diaminopropane: 0.1% by mass, tetramethylammonium fluoride: 0.5% by mass, acetic acid: 1.5% by mass, water: balance (Evaluation 1: Cleaning Properties)
The semiconductor device shown in FIG. 1 was dipped in each of the compositions for cleaning and corrosion inhibition, and after dipping at 25° C. for 2 minutes, was rinsed with ultrapure water and then dried. After passing through the foregoing steps, the surface state was observed by a scanning electron microscope (SEM: S-5500, manufactured by Hitachi High-Technologies Corporation), thereby evaluating removal properties of an etching residue, corrosion of a copper wiring material and damage of a Low-k material as the cleaning properties.

(Evaluation 2: Corrosion Inhibition Properties)
In order to confirm a corrosion inhibitory capability of the corrosion inhibitor, a silicon wafer in which a copper film had been formed over the entire surface thereof by means of plating was dipped in each of the compositions for cleaning and corrosion inhibition at 25° C. for 2 minutes and then rinsed with ultrapure water, followed by drying. Thereafter, this silicon wafer was dipped in ultrapure water having carbon dioxide dissolved therein (specific resistance: not more than 0.2 MΩ·cm, hereinafter referred to as "carbonated water") at 25° C. for 5 minutes. The resulting copper surface was observed by SEM, thereby determining the corrosion of copper. It may be considered that in a copper wiring material in which copper erodes, the corrosion inhibitor does not function.

(Evaluation 3: Corrosion Inhibition Properties)
In order to confirm a capability for suppressing the denaturation of copper by the corrosion inhibitor component, a silicon wafer in which a copper film had been formed over the entire surface thereof by means of plating was dipped in each of the compositions for cleaning and corrosion inhibition at 25° C. for 2 minutes and then rinsed with ultrapure water, followed by drying. Thereafter, the resulting silicon wafer was allowed to stand in a clean room having a humidity of 45% at 22° C. for 3 days, and the state of copper was then measured by an X-ray photoelectron spectrometer (XPS, manufactured by VG Scientific).

(Evaluation 4: Easy Removal Properties)
In order to confirm separation properties (removal properties) of the corrosion inhibitor component from the copper surface, the following experiment was carried out. First of all, a silicon wafer in which a copper film had been formed over the entire surface thereof by means of plating was dipped in a composition for cleaning and corrosion inhibition displaying the effect in the Evaluation 2 among those shown in the following Tables 1 to 2 at 25° C. for 2 minutes and then rinsed with ultrapure water, followed by drying. The resulting copper film was heated under a reduced pressure of 0.1 Pa at 200° C. for 5 minutes. Thereafter, the resulting copper film was dipped in carbonated water at 25° C. for 5 minutes, and the copper surface was observed by SEM. The composition for cleaning and corrosion inhibition displaying the effect in the Evaluation 2 forms a film capable of preventing the corrosion of copper with carbonated water on the surface of copper. If a protective film adhered onto the copper film is removed from the copper surface upon being heated under a reduced pressure, in the case of subsequently dipping the resulting copper film in carbonated water, the corrosion should be observed on the copper surface. Accordingly, in the Evaluation 2, what no corrosion was observed on copper through the SEM observation was a preferred result; whereas in the Evaluation 4, what corrosion was observed on copper through the SEM observation is determined as a preferred result.

TABLE 1

| Example | Cleaning solution | Corrosion inhibitor Type | Concentration (weight %) | Evaluation 1 Removal properties of etching residue | Evaluation 1 Corrosion inhibitory properties of copper | Evaluation 1 Damage of Low-k material | Evaluation 2 | Evaluation 3 | Evaluation 4 |
|---|---|---|---|---|---|---|---|---|---|
| 1 | A | 1,2,4-Triazole | 0.01 | AA | AA | AA | AA | AA | AA |
| 2 | B | 1,2,4-Triazole | 0.01 | AA | AA | AA | AA | AA | AA |
| 3 | C | 1,2,4-Triazole | 0.01 | AA | AA | AA | AA | AA | AA |
| 4 | A | Iminodiacetic acid | 1 | AA | AA | AA | AA | AA | AA |
| 5 | A | Diethyl disulfide | 0.1 | AA | AA | AA | AA | AA | AA |
| 6 | D | Pyrazole | 0.01 | AA | AA | AA | AA | AA | BB |
| 7 | D | 3,5-Dimethylpyrazole | 0.01 | AA | AA | AA | AA | AA | AA |
| 8 | B | 3,5-pyrazole dicarboxylic acid monohydrate | 0.01 | AA | AA | AA | BB | BB | AA |
| 9 | D | Hydroxyethylenediaminetriacetic acid | 0.01 | AA | AA | AA | BB | BB | BB |
| 10 | A | Pyrazole-1-carboxamidine hydrochloride | 0.01 | AA | AA | AA | AA | AA | BB |
| 11 | B | 3-Amino-5-hydroxy pyrazole | 0.01 | AA | AA | AA | AA | AA | BB |
| 12 | C | 1-Phenylpyrazole | 0.01 | AA | AA | AA | AA | AA | BB |
| 13 | D | 3-Amino-4-phenyl pyrazole | 0.01 | AA | AA | AA | AA | AA | BB |
| 14 | A | 4-Amino-3,5-dimethyl-1,2,4-triazole | 0.01 | AA | AA | AA | AA | AA | BB |

TABLE 1-continued

| | | Corrosion inhibitor | | Evaluation 1 | | | | | |
| | | | | Removal | Corrosion | | | | |
| | | | | properties | inhibitory | Damage | | | |
| Example | Cleaning solution | Type | Concentration (weight %) | of etching residue | properties of copper | of Low-k material | Evaluation 2 | Evaluation 3 | Evaluation 4 |
|---|---|---|---|---|---|---|---|---|---|
| 15 | C | Glycol ether diaminetetraacetic acid | 0.01 | BB | BB | BB | BB | BB | BB |
| 16 | D | Hydroxyethylimino-diacetic acid | 0.01 | BB | BB | AA | BB | BB | BB |
| 17 | A | Triethylenetetramine hexaacetic acid | 0.01 | AA | AA | AA | BB | BB | BB |
| 18 | A | Ethylenediamine-dipropionic acid hydrochloride | 0.01 | AA | AA | AA | AA | AA | AA |
| 19 | B | Diisopropyl disulfide | 0.01 | AA | AA | AA | AA | AA | AA |
| 20 | C | Dibutyl disulfide | 0.01 | AA | AA | AA | BB | BB | BB |

TABLE 2

| | | Corrosion inhibitor | | Evaluation 1 | | | | | |
| | | | | Removal | Corrosion | | | | |
| | | | | properties | inhibitory | Damage | | | |
| Comparative Example | Cleaning solution | Type | Concentration (weight %) | of etching residue | properties of copper | of Low-k material | Evaluation 2 | Evaluation 3 | Evaluation 4 |
|---|---|---|---|---|---|---|---|---|---|
| 1 | A | — | — | AA | AA | AA | DD | DD | — |
| 2 | B | — | — | AA | AA | AA | DD | DD | — |
| 3 | C | — | — | AA | AA | AA | DD | DD | — |
| 4 | A | Imidazole | — | DD | AA | AA | BB | BB | DD |
| 5 | B | Nicotinic acid | 0.1 | AA | BB | BB | DD | DD | — |
| 6 | D | — | — | AA | AA | AA | DD | DD | — |
| 7 | B | Benzotriazole | 1 | DD | AA | AA | AA | DD | DD |
| 8 | B | Glycine | 0.01 | AA | AA | AA | DD | DD | — |
| 9 | C | 1H-Tetrazole | 1 | DD | AA | AA | BB | DD | DD |
| 10 | C | Thiazole | 1 | BB | AA | AA | DD | DD | — |
| 11 | C | 2-Mercapto-2-thiazdine | 0.01 | DD | AA | AA | AA | DD | DD |
| 12 | C | 2-Mercapto-1-methylimidazole | 0.01 | DD | AA | AA | AA | CC | DD |
| 13 | A | 4-Amino-3-mercapto-4H-1,2,4-triazole | 0.01 | DD | AA | AA | AA | CC | DD |
| 14 | C | Polyacrylic acid, 25000 | 0.1 | AA | AA | AA | DD | DD | — |
| 15 | C | Mannose | 0.1 | AA | AA | AA | DD | DD | — |
| 16 | B | Uric acid | 0.01 | CC | BB | AA | BB | DD | DD |
| 17 | D | Adenine | 0.1 | CC | AA | AA | BB | CC | DD |
| 18 | D | Tetramethyl guanidine | 1 | CC | AA | CC | DD | DD | — |
| 19 | C | 2,2'-Bipyridyl | 0.1 | DD | AA | AA | DD | DD | — |
| 20 | B | 3-Amino-1,2,4-triazole-5-carboxylic acid | 0.01 | DD | AA | AA | AA | CC | DD |

The respective evaluation indexes in the foregoing tables are as follows. The evaluations marked with "AA" and "BB" are on a level where there is no problem in practical use.

(Removal Properties of Etching Reside in Evaluation 1)
AA: The etching residue was completely removed.
BB: The etching residue was substantially completely removed.
CC: A part of the etching residue remained.
DD: The major part of the etching reside remained.

[Corrosion Inhibitory Properties of Copper in Evaluation 1]
AA: Corrosion was not recognized at all.
BB: Corrosion was not substantially recognized.
CC: Corrosion in a crater shape or a pit shape was recognized.
DD: Roughness was recognized on the entire surface of the copper layer, and further, recession of the copper layer was recognized.

[Damage of Low-k Material in Evaluation 1]
AA: Change of the shape was not recognized at all.
BB: Change of the shape was not substantially recognized.
CC: Change of the shape was recognized a little.
DD: Change of the shape was significantly recognized.

(Evaluation 2)
AA: Corrosion was not recognized at all.
BB: Corrosion was not substantially recognized.

CC: Corrosion in a crater shape or a pit shape was recognized.

DD: Roughness was recognized on the entire surface of the copper layer, and further, recession of the copper layer was recognized.

(Evaluation 3)

AA: A denatured material of copper was not recognized at all.

BB: A denatured material of copper was not substantially recognized.

CC: A denatured material of copper was recognized a little.

DD: A denatured material of copper was significantly recognized.

(Evaluation 4)

AA: Corrosion was recognized on the entire surface of the copper layer.

BB: Corrosion was recognized in a part of the copper layer.

CC: Corrosion was not substantially recognized.

DD: Corrosion was not recognized at all.

As shown in Table 1, in Examples 1 to 20, an excellent protecting effect on the copper surface after cleaning was also revealed without impairing the performances of the cleaning solution (cleaning agent component), and the protective film could be easily removed by heating under a reduced pressure.

The invention claimed is:

1. A composition for cleaning and corrosion inhibition which is used during manufacturing of a semiconductor device or a display device having copper-containing metallic wiring, the composition consisting of a) a corrosion inhibitor component, b) a cleaning agent component and c) water as a remnant, wherein the corrosion inhibitor component is at least one member selected from the group consisting of pyrazole, 3,5-dimethylpyrazole, 3,5-pyrazoledicarboxylic acid monohydrate, pyrazole-1-carboxamidine hydrochloride, 3-amino-5-hydroxypyrazole, 1-phenylpyrazole, 3-amino-4-phenylpyrazole, 1,2,4-triazole, 4-amino-3,5-dimethyl-1,2,4-triazole, iminodiacetic acid, hydroxyethylenediaminetriacetic acid, glycol ether diaminetetraacetic acid, hydroxyethyliminodiacetic acid, triethylenetetraminehexaacetic acid, ethylenediaminedipropionic acid hydrochloride, diisopropyl disulfide, dibutyl disulfide and diethyl disulfide;

the cleaning agent component is at least one member selected from the group consisting of ammonium fluoride, tetramethylammonium fluoride, ammonium acetate, acetic acid, glyoxylic acid, oxalic acid, ascorbic acid, 1,2-diaminopropane and dimethylacetamide; and the corrosion inhibitor component has a concentration of from 0.001 to 5% by mass, and the cleaning agent component has a concentration of from 0.01 to 90% by mass.

2. The composition for cleaning and corrosion inhibition according to claim 1, wherein the corrosion inhibitor component has a concentration of from 0.001 to 5% by mass, and the cleaning agent component has a concentration of from 0.01 to 90% by mass.

3. A composition for cleaning and corrosion inhibition which is used during manufacturing of a semiconductor device or a display device having copper-containing metallic wiring, the composition consisting of a) a corrosion inhibitor component, b) a cleaning agent component and c) water as a remnant, wherein the corrosion inhibitor component is at least one member selected from the group consisting of pyrazole, 3,5-dimethylpyrazole, 3,5-pyrazoledicarboxylic acid monohydrate, pyrazole-1-carboxamidine hydrochloride, 3-amino-5-hydroxypyrazole, 1-phenylpyrazole, 3-amino-4-phenylpyrazole, 1,2,4-triazole, 4-amino-3,5-dimethyl-1,2,4-triazole, iminodiacetic acid, hydroxyethylenediaminetriacetic acid, glycol ether diaminetetraacetic acid, hydroxyethyliminodiacetic acid, triethylenetetraminehexaacetic acid, ethylenediaminedipropionic acid hydrochloride, diisopropyl disulfide, dibutyl disulfide and diethyl disulfide;

the cleaning agent component is at least one member selected from the group consisting of ammonium fluoride, tetramethylammonium fluoride, ammonium acetate, acetic acid, glyoxylic acid, oxalic acid, ascorbic acid, 1,2-diaminopropane and dimethylacetamide; and the cleaning solution is able to suppress the denaturation of copper during a time from removal of etching residue until just before depositing a diffusion preventive film on a surface of copper wiring and which, at the deposition of the diffusion preventive film, is able to easily remove the corrosion inhibitor component, thereby providing a clean copper surface; and the corrosion inhibitor component has a concentration of from 0.001 to 5% by mass, and the cleaning agent component has a concentration of from 0.01 to 90% by mass.

4. The cleaning composition of claim 3, wherein the corrosion inhibitor component is readily removed from the metallic wiring by a heat treatment under a pressure of from 0.001 to 600 Pa and at a temperature of from 100° C. to 300° C.

5. The composition for cleaning and corrosion inhibition according to claim 3, wherein the corrosion inhibitor component has a concentration of from 0.001 to 5% by mass, and the cleaning agent component has a concentration of from 0.01 to 90% by mass.

6. The composition for cleaning and corrosion inhibition according to claim 1, wherein the corrosion inhibitor component is readily removed from the metallic wiring by heat treatment under a pressure of from 0.001 to 600 Pa and at a temperature of from 100° C. to 300° C.

* * * * *

UNITED STATES PATENT AND TRADEMARK OFFICE
CERTIFICATE OF CORRECTION

| | |
|---|---|
| PATENT NO. | : 8,802,608 B2 |
| APPLICATION NO. | : 12/668695 |
| DATED | : August 12, 2014 |
| INVENTOR(S) | : K. Shimada et al. |

It is certified that error appears in the above-identified patent and that said Letters Patent is hereby corrected as shown below:

On the Title page (73) Assignee, (Col. 1, line 10) of the printed patent, "Comany" should be -- Company --.

Signed and Sealed this
Twelfth Day of May, 2015

Michelle K. Lee
*Director of the United States Patent and Trademark Office*